United States Patent
Li et al.

(10) Patent No.: US 12,191,315 B2
(45) Date of Patent: Jan. 7, 2025

(54) ARRAY SUBSTRATE COMPRISING A SHARING ELECTRODE AND DISPLAY PANEL

(71) Applicant: HKC CORPORATION LIMITED, Guangdong (CN)

(72) Inventors: Shasha Li, Guangdong (CN); Rongrong Li, Guangdong (CN)

(73) Assignee: HKC CORPORATION LIMITED, Shenzhen (CN)

(*) Notice: Subject to any disclaimer, the term of this patent is extended or adjusted under 35 U.S.C. 154(b) by 0 days.

(21) Appl. No.: 18/343,205

(22) Filed: Jun. 28, 2023

(65) Prior Publication Data

US 2024/0136364 A1 Apr. 25, 2024
US 2024/0234436 A9 Jul. 11, 2024

(30) Foreign Application Priority Data

Oct. 25, 2022 (CN) .......................... 202211306342.7

(51) Int. Cl.
*H01L 27/12* (2006.01)
*G02F 1/1362* (2006.01)
*G02F 1/1368* (2006.01)

(52) U.S. Cl.
CPC ...... *H01L 27/124* (2013.01); *G02F 1/136227* (2013.01); *G02F 1/136286* (2013.01); *G02F 1/1368* (2013.01); *H01L 27/127* (2013.01)

(58) Field of Classification Search
None
See application file for complete search history.

(56) References Cited

U.S. PATENT DOCUMENTS

2011/0114955 A1* 5/2011 Chun .................... H01L 27/124
                                                                 438/34
2020/0411557 A1    12/2020 Xi

FOREIGN PATENT DOCUMENTS

CN          102096260 A      6/2011
CN          107817631 A      3/2018
(Continued)

OTHER PUBLICATIONS

The first office action issued in corresponding CN application No. 202211306342.7 dated Dec. 1, 2022.
(Continued)

*Primary Examiner* — Paul C Lee
(74) *Attorney, Agent, or Firm* — HAUPTMAN HAM, LLP

(57) ABSTRACT

An array substrate and a method for manufacturing the same, and a display panel are provided. The array substrate includes a base substrate, gate lines, data lines, and multiple pixel units. The pixel unit includes a pixel electrode, a drive circuit, and a sharing electrode. The pixel electrode is electrically connected to the drive circuit. The drive circuit includes a first thin-film transistor, a second thin-film transistor, and a third thin-film transistor. A source of the third thin-film transistor is connected to a drain of the second thin-film transistor. A drain of the third thin-film transistor is connected to the sharing electrode. The sharing electrode includes a first sharing electrode and a second sharing electrode electrically connected to the first sharing electrode. The projection of the first sharing electrode on the base substrate at least partially overlaps the projection of the pixel electrode on the base substrate.

19 Claims, 8 Drawing Sheets

(56) References Cited

FOREIGN PATENT DOCUMENTS

| | | |
|---|---|---|
| CN | 109298574 A | 2/2019 |
| CN | 110931512 A | 3/2020 |
| CN | 112068371 A | 12/2020 |
| CN | 113594180 A | 11/2021 |
| CN | 215526310 U | 1/2022 |
| CN | 114236924 A | 3/2022 |
| CN | 114415434 A | 4/2022 |
| CN | 114967261 A | 8/2022 |
| CN | 115145082 A | 10/2022 |

OTHER PUBLICATIONS

Notice of allowance issued in corresponding CN application No. 202211306342.7 dated Dec. 22, 2022.

\* cited by examiner

ARRAY SUBSTRATE COMPRISING A SHARING ELECTRODE AND DISPLAY PANEL

CROSS-REFERENCE TO RELATED APPLICATIONS

This application claims priority under 35 U.S.C. § 119(a) to Chinese Patent Application No. 202211306342.7, filed Oct. 25, 2022, the entire disclosure of which is incorporated herein by reference.

TECHNICAL FIELD

This application relates to the field of display technology, and particularly to an array substrate and a method for manufacturing the same, and a display panel.

BACKGROUND

Display technology has always been one of important research directions in electronic equipment. For a display panel with a backlight source such as a Liquid Crystal Display (LCD), the brightness of light emitted to a surface of the display panel is only about 4%-6% of the brightness of light emitted from the backlight source. Therefore, display brightness is one of important specifications of the LCD. In the pixel design of the existing display panel, a light-transmitting region is relatively small, and accordingly, the transmittance of the light emitted from the backlight source is relatively low.

SUMMARY

In a first aspect, the disclosure provides an array substrate. The array substrate includes multiple gate lines extending along a first direction, multiple data lines extending along a second direction, and multiple pixel units defined by intersections of the gate lines and the data lines. The multiple pixel units each include a pixel electrode, a drive circuit, and a sharing electrode. The pixel electrode includes a first pixel electrode and a second pixel electrode. The drive circuit is electrically connected to the pixel electrode. The drive circuit includes a first thin-film transistor, a second thin-film transistor, and a third thin-film transistor. The first thin-film transistor has a drain electrically connected to the first pixel electrode. The second thin-film transistor has a drain electrically connected to the second pixel electrode. The third thin-film transistor has a source connected to the drain of the second thin-film transistor and has a drain connected to the sharing electrode. The sharing electrode includes a first sharing electrode and a second sharing electrode electrically connected to the first sharing electrode. The array substrate further includes a base substrate, a first metal layer disposed on one side of the base substrate, and a second metal layer disposed on one side of the first metal layer away from the base substrate. The gate lines and the first sharing electrode are formed in the first metal layer, and the data lines and the second sharing electrode are formed in the second metal layer. The projection of the first sharing electrode on the base substrate at least partially overlaps the projection of the pixel electrode on the base substrate.

In a second aspect, the disclosure further provides a method for manufacturing an array substrate. The method includes: providing a base substrate; forming a first metal layer on the base substrate, and forming gate lines, a common electrode, and a first sharing electrode by patterning the first metal layer; forming a first insulating layer on the first metal layer; defining an adapter hole in the first insulating layer; forming a second metal layer on the first insulating layer, and forming data lines, a source and a drain of a drive circuit, and a second sharing electrode by patterning the second metal layer, where the second sharing electrode is electrically connected to the first sharing electrode through the adapter hole; forming a second insulating layer on the second metal layer; defining a via hole in the second insulating layer; and manufacturing a transparent electrode layer on the second insulating layer, and forming a pixel electrode by patterning the transparent electrode layer.

In a third aspect, the disclosure further provides a display panel. The display panel includes a color-film substrate, a liquid-crystal layer, and the array substrate described in the first aspect. The array substrate is disposed opposite to and spaced apart from the color-film substrate to define a receiving space. The liquid-crystal layer is disposed in the receiving space.

BRIEF DESCRIPTION OF THE DRAWINGS

In order to describe technical solutions of implementations of the disclosure more clearly, the following will give a brief description of accompanying drawings used for describing the implementations. Apparently, accompanying drawings described below are merely some implementations of the disclosure. Those of ordinary skill in the art can also obtain other accompanying drawings based on the accompanying drawings described below without creative efforts.

DETAILED DESCRIPTION

Figure 1:
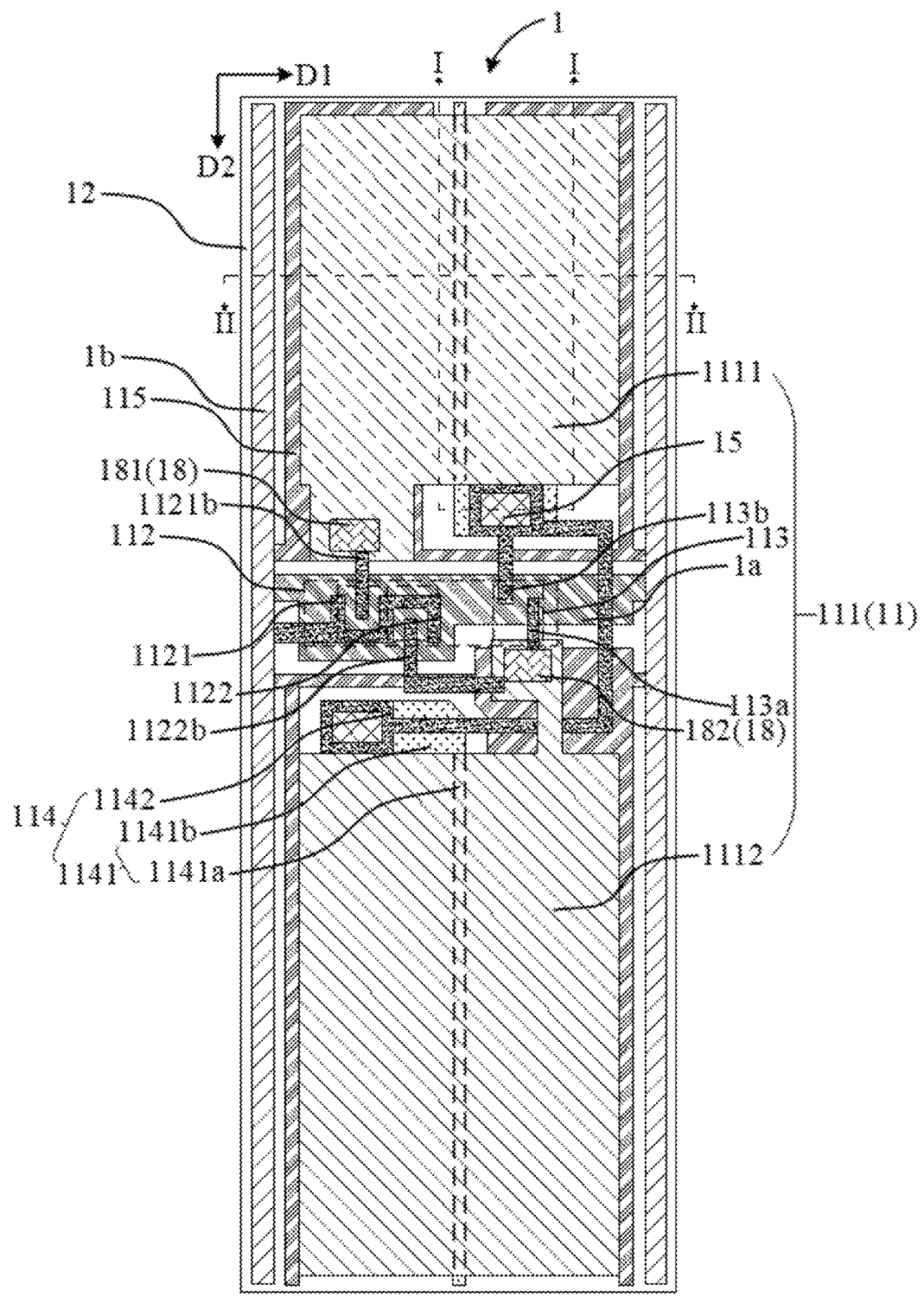
FIG. 1 is a schematic top view illustrating an array substrate provided in an implementation of the disclosure.

Hereinafter, technical solutions of implementations of the disclosure will be depicted clearly and completely with reference to accompanying drawings in the implementations. Apparently, implementations described below are merely some implementations, rather than all implementations of the disclosure. All other implementations obtained by those of ordinary skill in the art based on the implementations without creative efforts shall fall within the protection scope of the disclosure.

The disclosure provides an array substrate, which can solve a technical problem of a small light-transmitting region.

In a first aspect, the disclosure provides an array substrate. The array substrate includes multiple gate lines extending along a first direction, multiple data lines extending along a second direction, and multiple pixel units defined by intersections of the gate lines and the data lines. The multiple pixel units each include a pixel electrode, a drive circuit, and a sharing electrode. The pixel electrode includes a first pixel electrode and a second pixel electrode. The drive circuit is electrically connected to the pixel electrode. The drive circuit includes a first thin-film transistor, a second thin-film transistor, and a third thin-film transistor. The first thin-film transistor has a drain electrically connected to the first pixel electrode. The second thin-film transistor has a drain electrically connected to the second pixel electrode. The third thin-film transistor has a source connected to the drain of the second thin-film transistor and has a drain connected to the sharing electrode. The sharing electrode includes a first sharing electrode and a second sharing electrode electrically connected to the first sharing electrode. The array substrate further includes a base substrate, a first metal layer disposed on one side of the base substrate, and a second metal layer disposed on one side of the first metal layer away from the base substrate. The gate lines and the first sharing electrode are formed in the first metal layer, and the data lines and the second sharing electrode are formed in the second metal layer. The projection of the first sharing electrode on the base substrate at least partially overlaps the projection of the pixel electrode on the base substrate.

In some implementations, the array substrate further includes a first insulating layer. The first insulating layer at least partially covers the first sharing electrode and defines an adapter hole. The second sharing electrode is electrically connected to the first sharing electrode through the adapter hole.

In some implementations, the first pixel electrode is located on one side of the gate line, and the second pixel electrode is located on the other side of the same gate line.

In some implementations, the array substrate further includes a common electrode encircling the pixel electrode and a second insulating layer covering the second sharing electrode. The second insulating layer defines a via hole, and the pixel electrode is electrically connected to the drive circuit through the via hole.

In some implementations, the via hole includes a first via-hole and a second via-hole. The first pixel electrode is electrically connected to the first thin-film transistor through the first via-hole, and the second pixel electrode is electrically connected to the second thin-film transistor through the second via-hole. The first via-hole is close to the data line, the second via-hole is away from the same data line, and the adapter hole is away from the via hole relative to the same data line.

In some implementations, the first sharing electrode includes a first segment of the first sharing electrode disposed between the base substrate and the pixel electrode and a second segment of the first sharing electrode disposed between the pixel electrode and the gate line. The second segment of the first sharing electrode disposed on one side of the first pixel electrode is electrically connected to one end of the second sharing electrode. The second segment of the first sharing electrode disposed on one side of the second pixel electrode is electrically connected to the other end of the second sharing electrode.

In some implementations, the first thin-film transistor, the second thin-film transistor, and the third thin-film transistor are disposed along the first direction.

In some implementations, the second segment of the first sharing electrode is wider than the first segment of the first sharing electrode.

In some implementations, the first sharing electrode comprises a first segment of the first sharing electrode disposed between the base substrate and the pixel electrode and a second segment of the first sharing electrode disposed between the pixel electrode and the gate line; the first segment of the first sharing electrode passes through the pixel electrode along the second direction.

In some implementations, the first thin-film transistor and the second thin-film transistor form a common-gate and common-source structure.

In a second aspect, the disclosure further provides a method for manufacturing an array substrate. The method includes: providing a base substrate; forming a first metal layer on the base substrate, and forming gate lines, a common electrode, and a first sharing electrode by patterning the first metal layer; forming a first insulating layer on the first metal layer; defining an adapter hole in the first insulating layer; forming a second metal layer on the first insulating layer, and forming data lines, a source and a drain of a drive circuit, and a second sharing electrode by patterning the second metal layer, where the second sharing electrode is electrically connected to the first sharing electrode through the adapter hole; forming a second insulating layer on the second metal layer; defining a via hole in the second insulating layer; and manufacturing a transparent electrode layer on the second insulating layer, and forming a pixel electrode by patterning the transparent electrode layer.

In a third aspect, the disclosure further provides a display panel. The display panel includes a color-film substrate, a liquid-crystal layer, and the array substrate described in the first aspect. The array substrate is disposed opposite to and spaced apart from the color-film substrate to define a receiving space. The liquid-crystal layer is disposed in the receiving space.

Technical effects of the disclosure lie in that: an array substrate and a method for manufacturing the same, and a display panel are provided, on the one hand, the first sharing electrode is disposed in the first metal layer, and the projection of the first sharing electrode on the base substrate at least partially overlaps the projection of the pixel electrode on the base substrate, which can simplify a layout structure of the second metal layer; on the other hand, the second sharing electrode is disposed in the second metal layer, and the first sharing electrode is electrically connected to the second sharing electrode, which can prevent the sharing electrode from forming a jagged edge, thereby improving a display effect.

Figure 2:
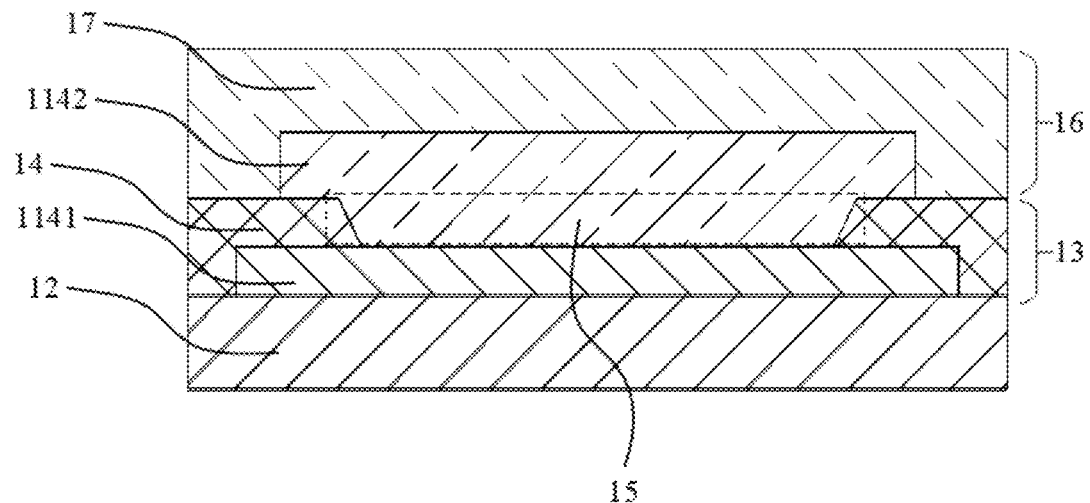
FIG. 2 is a schematic cross-sectional view along line I-I in FIG. 1.

The disclosure provides an array substrate 1. Referring to FIG. 1 and FIG. 2, FIG. 1 is a schematic top view illustrating an array substrate provided in an implementation of the disclosure, and FIG. 2 is a schematic cross-sectional view along line I-I in FIG. 1. An array substrate 1 includes multiple gate lines 1a extending along a first direction D1, multiple data lines 1b extending along a second direction D2, and multiple pixel units 11. The pixel unit 11 includes a pixel electrode 111, a drive circuit 112, and a sharing electrode 114. The pixel electrode 111 includes a first pixel electrode 1111 and a second pixel electrode 1112. The drive circuit 112 is electrically connected to the pixel electrode 111. The drive circuit 112 includes a first thin-film transistor 1121, a second thin-film transistor 1122, and a third thin-film transistor 113. A drain 1121*b* of the first thin-film transistor is electrically connected to the first pixel electrode 1111. A drain 1122*b* of the second thin-film transistor is electrically connected to the second pixel electrode 1112. A source 113*a* of the third thin-film transistor is electrically connected to the drain 1122*b* of the second thin-film transistor. The sharing electrode 114 includes a first sharing electrode 1141 and a second sharing electrode 1142. The first sharing electrode 1141 is electrically connected to the second sharing electrode 1142. The sharing electrode 114 is connected to a drain 113*b* of the third thin-film transistor.

The array substrate 1 further includes a base substrate 12, a first metal layer 13, and a second metal layer 16. The gate lines 1*a* and the first sharing electrode 1141 are formed in the first metal layer 13. The first metal layer 13 is disposed on one side of the base substrate 12. The data lines 1*b* and the second sharing electrode 1142 are formed in the second metal layer 16. The second metal layer 16 is disposed on one side of the first metal layer 13 away from the base substrate 12. The projection of the first sharing electrode 1141 on the base substrate 12 at least partially overlaps the projection of the pixel electrode 111 on the base substrate 12.

Specifically, the pixel unit 11 includes the pixel electrode 111, the drive circuit 112, and the sharing electrode 114. Light can pass through the pixel electrode 111, but cannot or almost cannot pass through the drive circuit 112, the third thin-film transistor 113, and the sharing electrode 114. It can be understood that, since display brightness is one of specifications for testing a display, in order to realize a better display effect, the proportion of an area of the pixel electrode 111 should be as large as possible.

Specifically, the source 113*a* of the third thin-film transistor is connected to the drain 1122*b* of the second thin-film transistor, and the drain 113*b* of the third thin-film transistor is connected to the second sharing electrode 1142. A sharing-electrode voltage is transmitted to the second sharing electrode 1142 through the third thin-film transistor 113, and the second sharing electrode 1142 is electrically connected to the first sharing electrode 1141, so that the sharing electrode voltage is transmitted to the first sharing electrode 1141 through the second sharing electrode 1142, to realize signal transmission.

Specifically, the projection of the first sharing electrode 1141 on the base substrate 12 at least partially overlaps the projection of the pixel electrode 111 on the base substrate 12, that is, a first segment 1141*a* of the first sharing electrode; a first segment 1141*a* of the first sharing electrode passes through the pixel electrode 111 along the second direction D2.

Specifically, the first sharing electrode 1141 is located in the first metal layer 13, the second sharing electrode 1142 is located in the second metal layer 16, and the second sharing electrode 1142 is disposed above the first sharing electrode 1141.

It is to be noted that, in the related art, the sharing electrode 114 and the second metal layer 16 are formed by etching in a same process, which easily leads to uneven etching of the edge of the sharing electrode 114. As a result, a jagged edge is formed, which leads to a phenomenon of light dark field at the jagged edge. Therefore, in the related art, a pad layer is generally added on the first metal layer 13 and a width of the pad layer is larger than that of the sharing electrode 114, so as to shield the sharing electrode 114, which, however, reduces the proportion of an area of the pixel electrode 111 of the array substrate 1, resulting in a reduction of light passing through the pixel electrode 111 and a decrease in light transmittance.

It can be understood that, in this implementation, as illustrated in FIG. 2, the first sharing electrode 1141 and the second sharing electrode 1142 electrically connected to each other are respectively disposed in different metal layers, and the first sharing electrode 1141 below the pixel electrode 111 belongs to the first metal layer 13, which can avoid the jagged edge caused by etching in the same process as a semiconductor layer, and can further avoid adding of an additional pad-layer structure that is wider than the first sharing electrode 1141 in the related art, thereby reducing an area of a non-light-transmitting region, increasing an area of a light-transmitting region, increasing light transmittance, and improving a display effect.

It is to be noted that, a same filling pattern in FIG. 1 represents a same hierarchical structure, and some hierarchical structures are illustrated in perspective in FIG. 1. For a specific hierarchical relationship, reference may be made to schematic cross-sectional views of the disclosure provided below. In this implementation, the array substrate 1 can be applied to a Liquid Crystal Display (LCD), that is, a backlight source is further provided at one side of the array substrate 1, light emitted by the backlight source passes through the array substrate 1 and then is exited from one side of the LCD, and the array substrate 1 plays a role of adjusting the light emitted by the backlight source, to realize a function of image display.

In this implementation, referring to FIG. 1 again, it is to be noted that, the LCD further includes a liquid-crystal layer. The working principle of the liquid-crystal layer is that: a certain voltage is applied to upper and lower sides of the liquid-crystal layer to change a rotation angle of liquid crystal, so as to adjust transmittance of light passing through the liquid-crystal layer. In this implementation, the first sharing electrode 1141 is used to provide a voltage signal for one side of the liquid-crystal layer.

It can be understood that, there must be losses during transmission of a current/voltage in a line. In this implementation, the first segment 1141*a* of the first sharing electrode passes through the pixel electrode 111 along the second direction D2, which can increase a line of the first sharing electrode 1141, so that a voltage at the same side of the pixel electrode 111 is more uniform, thereby realizing a uniform display effect.

In a possible implementation, referring to FIG. 1 again, the array substrate 1 includes a first insulating layer 14, where the first insulating layer 14 at least partially covers the first sharing electrode 1141 and defines an adapter hole 15. The second sharing electrode 1142 is electrically connected to the first sharing electrode 1141 through the adapter hole 15.

Specifically, the first sharing electrode 1141 is disposed in the first metal layer 13, and the second sharing electrode 1142 is disposed in the second metal layer 16. The first insulating layer 14 defining the adapter hole 15 is disposed between the first metal layer 13 and the second metal layer 16. In other words, since the first insulating layer 14 defines the adapter hole 15, the second sharing electrode 1142 in the second metal layer 16 can be connected to the first sharing electrode 1141 in the first metal layer 13.

It can be understood that, the first sharing electrode 1141 is electrically connected to the second sharing electrode 1142 through the adapter hole 15, which can avoid forming of the jagged edge on the sharing electrode 114 and adding of an additional pad-layer structure in the related art, reducing the space occupied by the insulating layer, and realizing transmission of the sharing-electrode voltage between the first pixel electrode and the second pixel electrode, thereby increasing transmittance of the array substrate and improving a display effect.

In a possible implementation, referring to FIG. 1 again, the first pixel electrode 1111 is located on one side of the gate line 1a, and the second pixel electrode 1112 is located on the other side of the same gate line 1a.

Specifically, the first pixel electrode 1111 is connected to the gate line 1a through the first thin-film transistor 1121, and the second pixel electrode 1112 is connected to the same gate line 1a through the second thin-film transistor 1122.

It is to be noted that, the first thin-film transistor 1121 and the second thin-film transistor 1122 form a common-gate and common-source structure. The gate line 1a serves as a common gate of the first thin-film transistor 1121 and the second thin-film transistor 1122, and a common source of the first thin-film transistor 1121 and the second thin-film transistor 1122 is an integral structure and connected to the data line 1b.

It can be understood that, in this implementation, the first pixel electrode 1111 is connected to the gate line 1a through the first thin-film transistor 1121 and is located on one side of the gate line 1a; the second pixel electrode 1112 is connected to the gate line 1a through the second thin-film transistor 1122 and is located on the other side of the gate line 1a. Moreover, the first thin-film transistor 1121 and the second thin-film transistor 1122 form a common-gate and common-source structure, which can reduce the number of wiring, optimize a stacked structure, simplify layout of the array substrate and a corresponding manufacturing process, thereby increasing light transmittance and improving a display effect.

Figure 3:
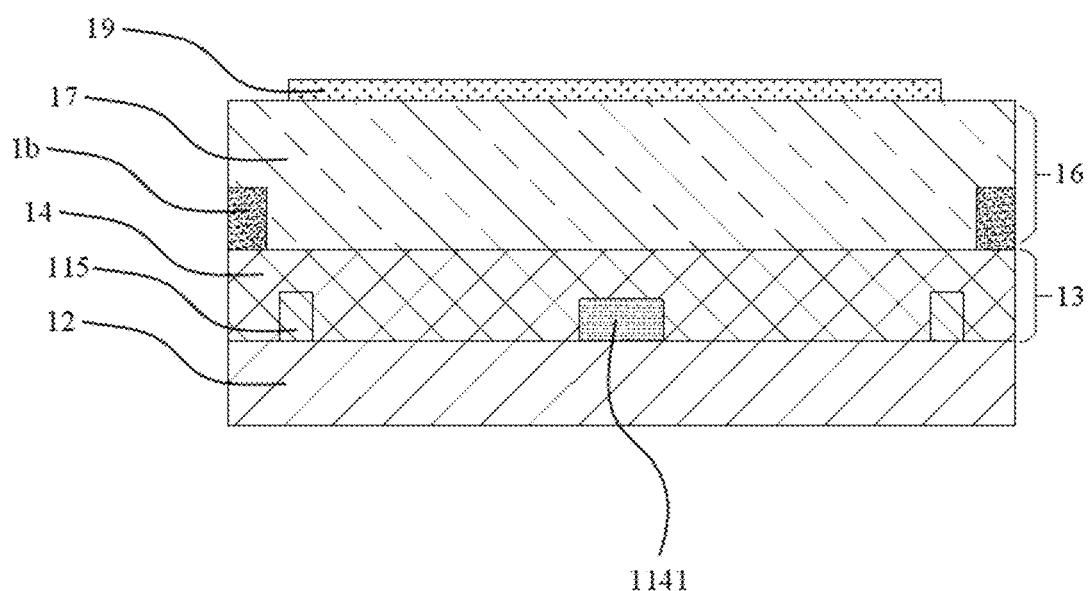
FIG. 3 is a schematic cross-sectional view along line II-II in FIG. 1.

In a possible implementation, referring to FIG. 1 and FIG. 3, FIG. 3 is a schematic cross-sectional view along line II-II in FIG. 1. The array substrate 1 further includes a common electrode 115 encircling the pixel electrode 111 and a second insulating layer 17 covering the second sharing electrode 1142. The second insulating layer 17 defines a via hole 18. The pixel electrode 111 is electrically connected to the drive circuit 112 through the via hole 18.

Specifically, the common electrode 115 is located in the first metal layer 13 and disposed around four sides of the pixel unit 11.

It can be understood that, the common electrode 115 is disposed around the four sides of the pixel unit 11, to provide a conductive path and transmit a voltage signal. The second insulating layer 17 defines the via hole 18, and the pixel electrode 111 is electrically connected to the drive circuit 112 through the via hole 18, which can reduce the number of wiring and optimize the stacked structure, thereby further increasing the light transmittance and improving the display effect.

In this implementation, as illustrated in FIG. 3, the data line 1b is formed in the second metal layer 16, the second insulating layer 17 is formed in the second metal layer 16, and the first sharing electrode 1141 and the first insulating layer 14 are formed in the first metal layer 13. Planarization of a surface of the second insulating layer 17 in contact with one side of a transparent electrode layer 19 can be realized, thereby improving a display effect. The second insulating layer 17 is also used to provide electrical insulation between the second metal layer 16 and the first insulating layer 14. Specifically, the second insulating layer 17 further defines the via hole 18, so that the transparent electrode layer 19 and the drive circuit 112 are bridged.

It can be understood that, since an area of the non-light-transmitting region is relatively small, an area of the transparent electrode layer 19 that allows light to pass through is increased, thereby increasing the light transmittance and improving a display quality.

In a possible implementation, referring to FIG. 1 again, the via hole 18 includes a first via-hole 181 and a second via-hole 182. The first pixel electrode 1111 is electrically connected to the first thin-film transistor 1121 through the first via-hole 181, and the second pixel electrode 1112 is electrically connected to the second thin-film transistor 1122 through the second via-hole 182. The first via-hole 181 is close to the data line 1b, the second via-hole 182 is away from the same data line 1b, and the adapter hole 15 is away from the via hole 18 relative to the same data line 1b.

Specifically, the first via-hole 181 is close to the data line 1b, the second via-hole 182 is away from the same data line 1b, and the first via-hole 181 and the second via-hole 182 are aligned in a first diagonal direction. For a same data line 1b, the adapter hole 15 is away from a via hole 18 which is on the same side of the data line 1b as the adapter hole 15, and adapter holes 15 are aligned in a second diagonal direction. The first diagonal direction and the second diagonal direction intersect each other.

It can be understood that, the first pixel electrode 1111 is electrically connected to the first thin-film transistor 1121 through the first via-hole 181, and the second pixel electrode 1112 is electrically connected to the second thin-film transistor 1122 through the second via-hole 182. The first via-hole 181 is close to the data line 1b, the second via-hole 182 is away from the same data line 1b, and the first via-hole 181 and the second via-hole 182 are aligned in the first diagonal direction. For the same data line 1b, the adapter hole 15 is away from one side of the via hole 18 on the same side as the adapter hole 15, and adapter holes 15 are aligned in the second diagonal direction, where the first diagonal direction and the second diagonal direction intersect each other. As such, an electrical signal interference between the adapter hole 15 and the via hole 18 can be reduced, the connection between the pixel electrode 111 and the drive circuit 112 can be realized through the via hole 18, and transmission of a sharing-electrode signal between the first pixel electrode 1111 and the second pixel electrode 1112 can be realized through the adapter hole 15, thereby increasing the light transmittance and improving the display effect.

In a possible implementation, referring to FIG. 1 again, the first sharing electrode 1141 includes a first segment 1141a of the first sharing electrode disposed between the base substrate 12 and the pixel electrode 111 and a second segment 1141b of the first sharing electrode disposed between the pixel electrode 111 and the gate line 1a. The second segment 1141b of the first sharing electrode disposed on one side of the first pixel electrode 1111 is electrically connected to one end of the second sharing electrode 1142. The second segment 1141b of the first sharing electrode disposed on one side of the second pixel electrode 1112 is electrically connected to the other end of the second sharing electrode 1142.

Specifically, the projection of the first sharing electrode 1141 on the base substrate 12 at least partially overlaps the projection of the pixel electrode 111 on the base substrate 12, that is, the first segment 1141a of the first sharing electrode. The first segment 1141a of the sharing electrode passes through the pixel electrode 111 along the second direction D2. The second segment 1141b of the first sharing electrode encircles one side of a via hole 18 on the same side as the second segment 1141b. The first segment 1141a and the second segment 1141b of the first sharing electrode are an integral structure.

It can be understood that, the first sharing electrode 1141 includes the first segment 1141a of the first sharing electrode disposed between the base substrate 12 and the pixel electrode 111 and the second segment 1141b of the first sharing electrode disposed between the pixel electrode 111 and the gate line 1a. The second segment 1141b of the first sharing electrode disposed on one side of the first pixel electrode 1111 is electrically connected to one end of the second sharing electrode 1142 through the adapter hole 15. The second segment 1141b of the first sharing electrode disposed on one side of the second pixel electrode 1112 is electrically connected to the other end of the second sharing electrode 1142 through the adapter hole 15. As such, a stacked structure can be optimized, a pad layer of the first metal layer 13 in the related art can be removed, the space occupied by the insulating layer can be reduced, and transmission of the sharing-electrode signal between the first pixel electrode and the second pixel electrode can be realized, thereby improving the transmittance of the array substrate and the display effect.

In a possible implementation, referring to FIG. 1 again, the first thin-film transistor 1121, the second thin-film transistor 1122, and the third thin-film transistor 113 are disposed along the first direction D1.

Specifically, the first thin-film transistor 1121, the second thin-film transistor 1122, and the third thin-film transistor 113 are disposed in the first direction D1 of the gate line 1a. The first thin-film transistor 1121 and the second thin-film transistor 1122 form a common-gate and common-source structure. The common-gate and common-source structure is spaced apart from the third thin-film transistor 113 in the first direction D1. The first thin-film transistor 1121 is configured to drive the first pixel electrode 1111, and the second thin-film transistor 1122 is configured to drive the second pixel electrode 1112.

It is to be noted that, in other possible implementations, there may be other numbers of the drive circuits 112 and the third thin-film transistors 113, which are not limited in the disclosure.

It can be understood that, the first thin-film transistor 1121 and the second thin-film transistor 1122 form a common-gate and common-source structure. The common-gate and common-source structure is spaced apart from the third thin-film transistors 113 in the first direction D1. The first thin-film transistor 1121 is configured to drive the first pixel electrode 1111, and the second thin-film transistor 1122 is configured to drive the second pixel electrode 1112. As such, an occupancy rate of a device space and an occupancy space of the insulating layer can be reduced, a stack structure can be optimized, and transmission of the sharing electrode signal between the first pixel electrode and the second pixel electrode can be realized, thereby improving the transmittance of the array substrate and the display effect.

In a possible implementation, referring to FIG. 1 again, a width of the second segment 1141b of the first sharing electrode is greater than a width of the first segment 1141a of the first sharing electrode.

Specifically, the width of the second segment 1141b of the first sharing electrode is greater than the width of the first segment 1141a of the first sharing electrode, and a length of the second segment 1141b of the first sharing electrode is less than a length of the first segment 1141a of the first sharing electrode.

It can be understood that, the second segment 1141b of the first sharing electrode is wider than the first segment 1141a of the first sharing electrode, which is beneficial to defining the adapter hole 15 in the first insulating layer 14 on the second segment 1141b of the first sharing electrode. Moreover, while ensuring a function of the first segment 1141a of the first sharing electrode, the width of the first segment 1141a of the first sharing electrode should be as small as possible, and accordingly, an area of the first segment 1141a should be small, so that an area of a space occupied by the pixel electrode 111 is as large as possible, thereby optimizing a device layout structure, increasing the transmittance of the array substrate, and improving the display effect.

Figure 4:
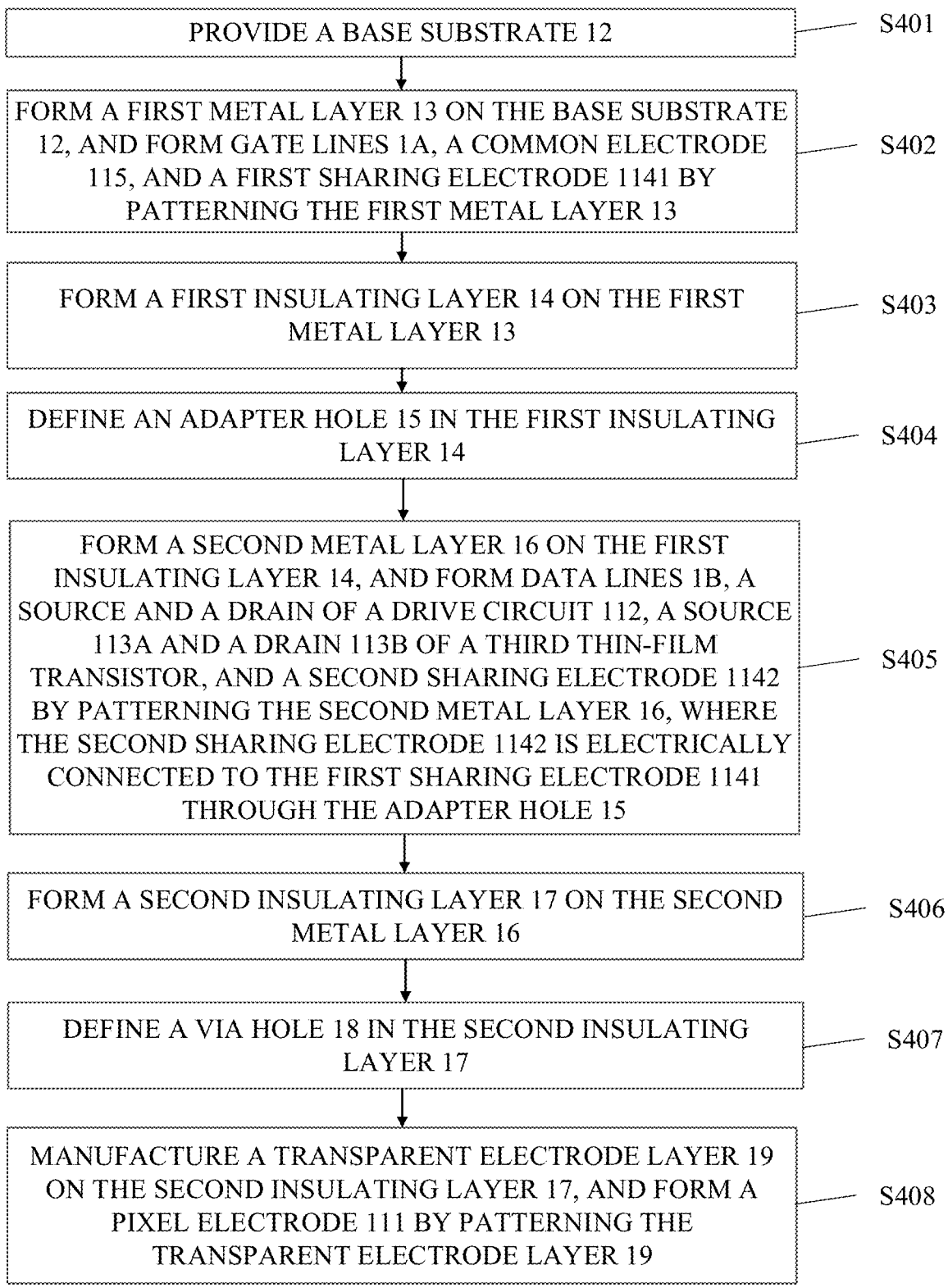
FIG. 4 is a schematic flow chart illustrating a method for manufacturing an array substrate provided in an implementation of the disclosure.

The disclosure further provides a method for manufacturing an array substrate. Also, referring to FIG. 4, FIG. 4 is a schematic flowchart illustrating a method for manufacturing an array substrate provided in an implementation of the disclosure. The method includes operations from S401 to S408, and the operations from S401 to S408 will be depicted in detail below.

At S401, a base substrate 12 is provided.

At S402, a first metal layer 13 is formed on the base substrate 12, and gate lines 1a, a common electrode 115, and a first sharing electrode 1141 are formed by patterning the first metal layer 13.

Figure 5:
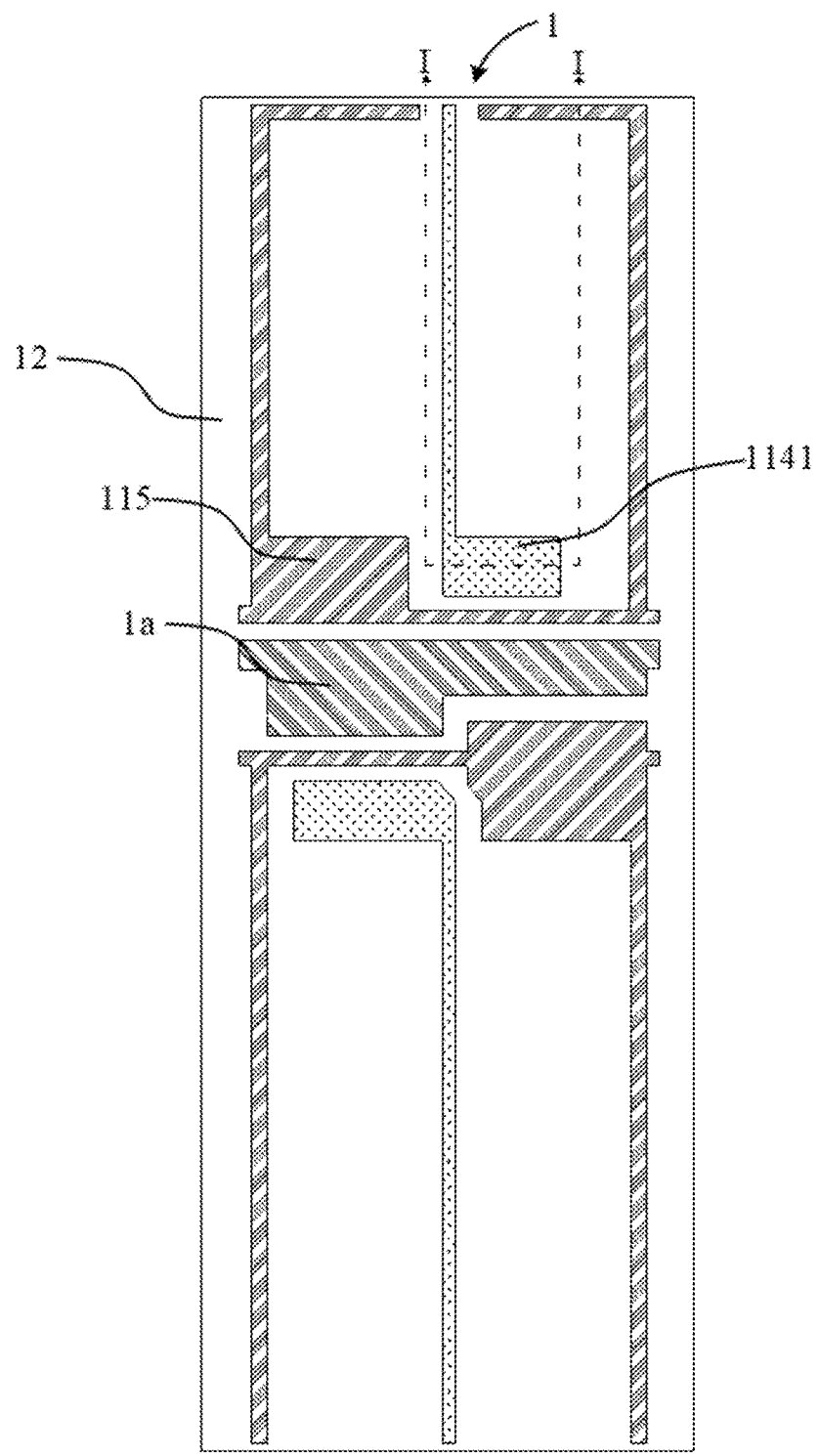
FIG. 5 is a schematic top view illustrating array substrate manufacturing provided in an implementation of the disclosure.
Figure 6:
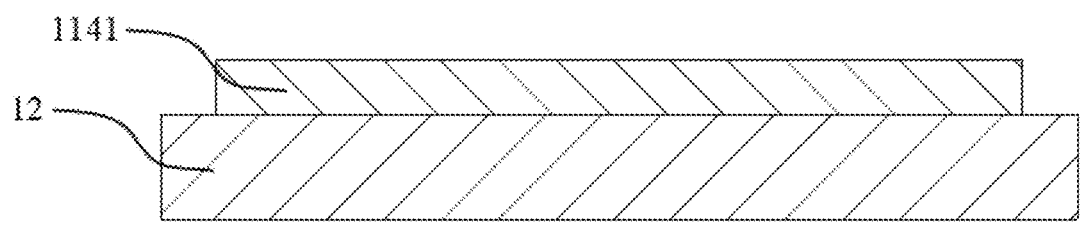
FIG. 6 is a schematic cross-sectional view along line I-I in FIG. 5.

Specifically, referring to FIG. 5 and FIG. 6, FIG. 5 is a schematic top view illustrating array substrate manufacturing provided in an implementation of the disclosure, and FIG. 6 is a schematic cross-sectional view along line I-I in FIG. 5. In this implementation, the common electrode 115 and the first sharing electrode 1141 are formed by etching the first metal layer 13 through a mask. For details of the first metal layer 13, the gate line 1a, the common electrode 115, and the first sharing electrode 1141, reference can be made to the foregoing description, which will not be repeated herein.

At S403, a first insulating layer 14 is formed on the first metal layer 13.

Specifically, the first insulating layer 14 at least partially covers the first sharing electrode 1141.

At S404, an adapter hole 15 is defined in the first insulating layer 14.

At S405, a second metal layer 16 is formed on the first insulating layer 14, and data lines 1b, a source and a drain of a drive circuit 112, and a second sharing electrode 1142 are formed by patterning the second metal layer 16, where the second sharing electrode 1142 is electrically connected to the first sharing electrode 1141 through the adapter hole 15.

Figure 7:
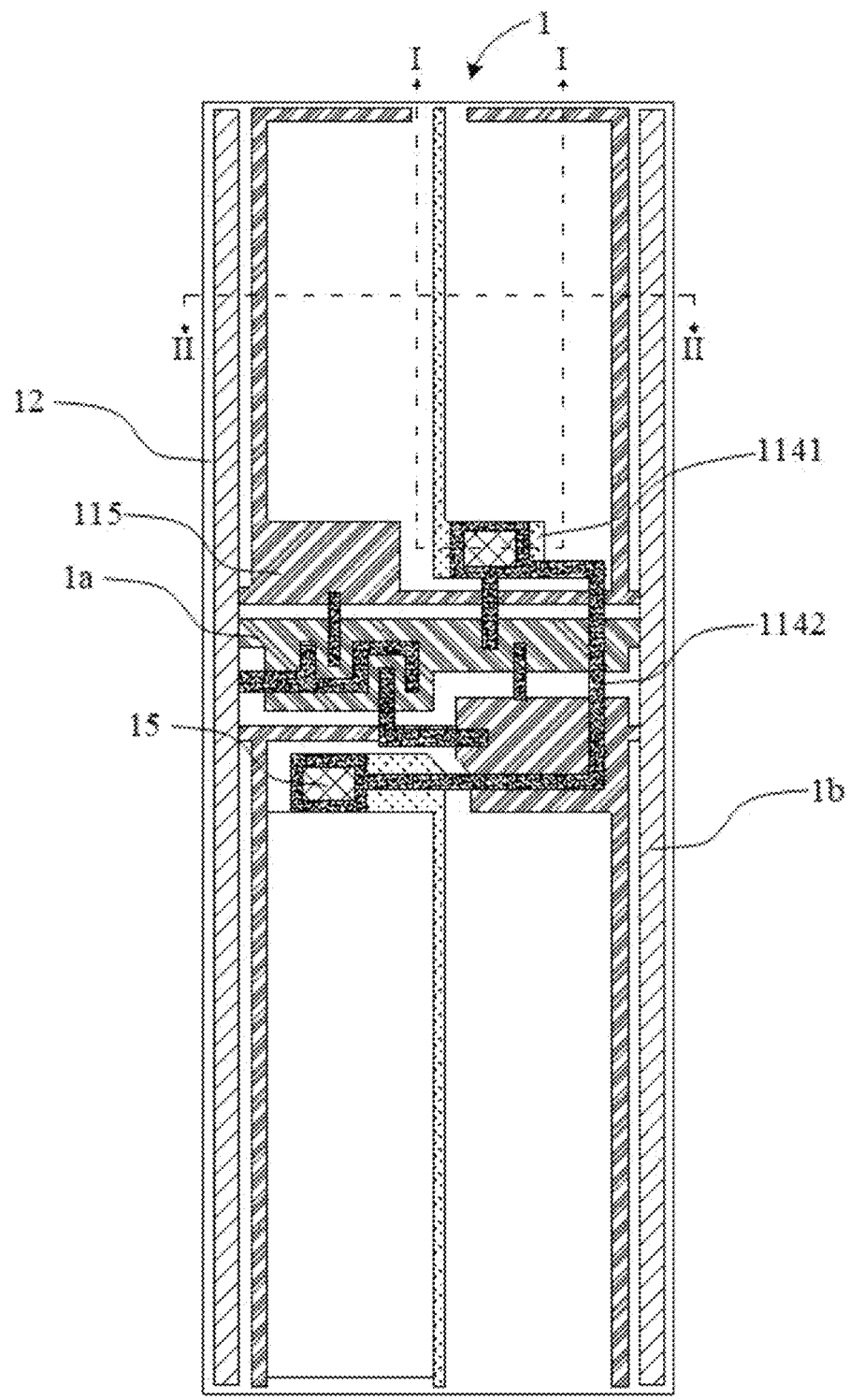
FIG. 7 is a schematic top view illustrating array substrate manufacturing provided in another implementation of the disclosure.
Figure 8:
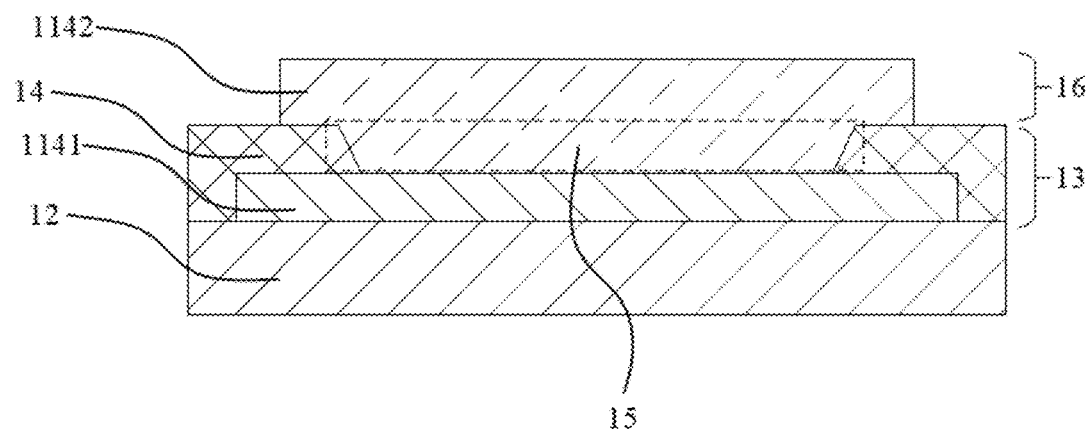
FIG. 8 is a schematic cross-sectional view along line I-I in FIG. 7.
Figure 9:
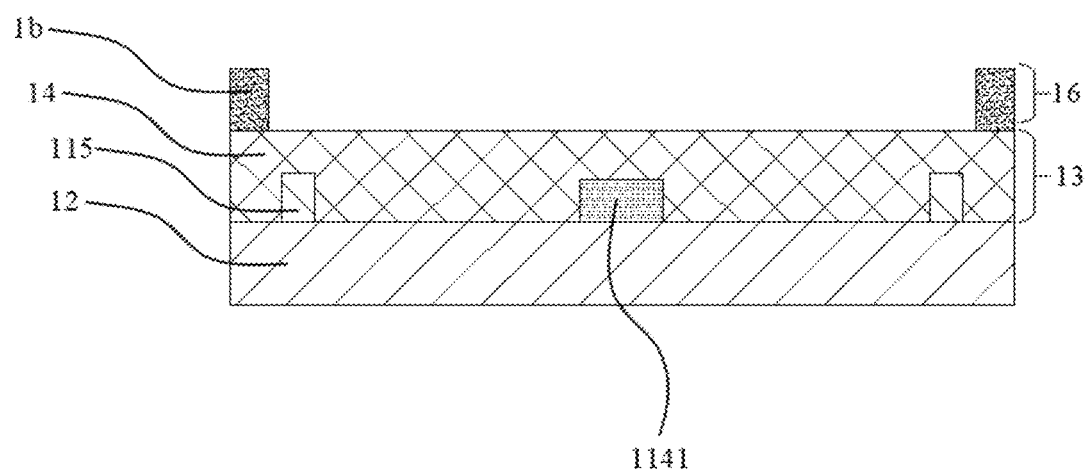
FIG. 9 is a schematic cross-sectional view along line II-II in FIG. 7.

Specifically, referring to FIG. 7, FIG. 8, and FIG. 9, FIG. 7 is a schematic top view illustrating array substrate manufacturing provided in another implementation of the disclosure, FIG. 8 is a schematic cross-sectional view along line I-I in FIG. 7, and FIG. 9 is a schematic cross-sectional view along line II-II in FIG. 7. In this implementation, the source and the drain of the drive circuit 112 and the second sharing electrode 1142 are formed by etching the second metal layer 16 through a mask, which can avoid adding of an additional pad layer in the related art, so that an area of a light-transmitting region of the array substrate 1 is increased, thereby increasing light transmittance. For details of the first insulating layer 14, the adapter hole 15, the second metal layer 16, the data line 1b, the source and the drain of the drive circuit 112, the source 113a and the drain 113b of the third thin-film transistor, and the second sharing electrode 1142, reference can be made to the foregoing description, which will not be repeated herein.

At S406, a second insulating layer 17 is formed on the second metal layer 16.

At S407, a via hole 18 is defined in the second insulating layer 17.

At S408, a transparent electrode layer 19 is manufactured on the second insulating layer 17, and a pixel electrode 111 is formed by patterning the transparent electrode layer 19.

Specifically, referring to FIG. 1 again, the second insulating layer 17 covers the second sharing electrode 1142, so that planarization of a surface of the second insulating layer 17 in contact with one side of the transparent electrode layer 19 can be realized while the second insulating layer 17 can protect the second sharing electrode 1142, thereby improving a display effect. Moreover, the second insulating layer 17 is also used for electrical insulation between the second metal layer 16 and the first insulating layer 14. The via hole 18 is used to realize an electrical connection between the pixel electrode 111 and the drive circuit 112. For details of the second metal layer 16, the second insulating layer 17, the via hole 18, the transparent electrode layer 19, and the pixel electrode 111, reference can be made to the foregoing description, which will not be repeated herein.

It can be understood that, in this implementation, the first sharing electrode 1141 is electrically connected to the second sharing electrode 1142 through the adapter hole 15, which can reduce a space occupied by the first insulating layer 14. Moreover, the second sharing electrode wire 1142 is directly disposed on a side surface of the first insulating layer 14 away from the first sharing electrode 1141, so that a thickness of the array substrate 1 in a stacked direction is reduced, which can reduce an area of a non-light-transmitting region and increase an area of a light-transmitting region of the array substrate 1, thereby increasing the light transmittance and improving the display effect.

It is to be noted that, in the disclosure, forming of the first sharing electrode 1141, the second sharing electrode 1142, the source 113a and the drain 113b of the third thin-film transistor, and so on by etching the metal layer through a mask is exemplarily depicted, which, however, does not mean that forming of the involved lines is limited in the disclosure, as long as it does not affect that the second sharing electrode 1142 is electrically connected to the first sharing electrode 1141 through the adapter hole 15, which is not limited in the disclosure.

Figure 10:
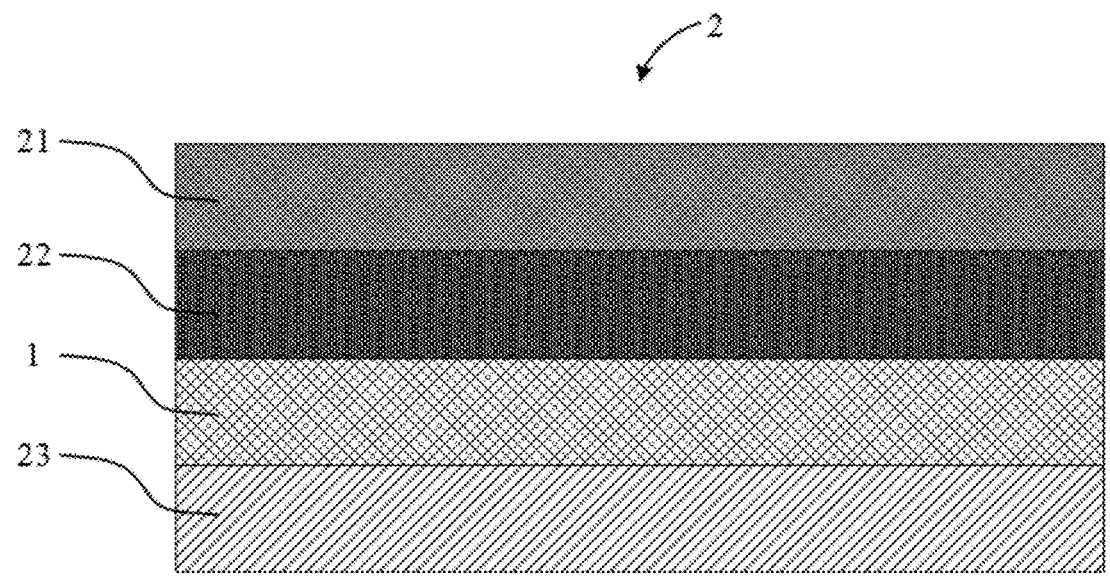
FIG. 10 is a schematic cross-sectional view illustrating a display panel provided in an implementation of the disclosure.

The disclosure further provides a display panel 2. Also, referring to FIG. 10, FIG. 10 is a schematic cross-sectional view illustrating a display panel provided in an implementation of the disclosure. The display panel 2 includes a color-film substrate 21, a liquid-crystal layer 22, a backlight source 23, and the above array substrate 1. The array substrate 1 is disposed opposite to and spaced apart from the color-film substrate 21 to form a receiving space. The liquid-crystal layer 22 is disposed in the receiving space. Specifically, for details of the array substrate 1, reference can be made to the foregoing description, which will not be repeated herein.

It can be understood that, in this implementation, the array substrate 1 has relatively high transmittance, so that light emitted by the backlight source 23 and passing through the array substrate 1, the liquid-crystal layer 22, and the color-film substrate 21 enables the display panel 2 to increase the display brightness by about 3%, compared to the related art.

While the principles and implementations of the disclosure have been depicted in connection with illustrative implementations, it is to be understood that foregoing implementations are merely used to help understand the core idea of the disclosure. As will occur to those skilled in the art, the disclosure is susceptible to various modifications and changes without departing from the spirit and principle of the disclosure. Therefore, the disclosure is not to be limited to the disclosed implementations.

What is claimed is:

1. An array substrate, comprising a plurality of gate lines extending along a first direction, a plurality of data lines extending along a second direction, and a plurality of pixel units defined by intersections of the gate lines and the data lines; the plurality of pixel units each comprising a pixel electrode, a drive circuit, and a sharing electrode; the pixel electrode comprising a first pixel electrode and a second pixel electrode; the drive circuit being electrically connected to the pixel electrode; the drive circuit comprising a first thin-film transistor, a second thin-film transistor, and a third thin-film transistor, the first thin-film transistor having a drain electrically connected to the first pixel electrode, the second thin-film transistor having a drain electrically connected to the second pixel electrode, and the third thin-film transistor having a source connected to the drain of the second thin-film transistor and having a drain connected to the sharing electrode; the sharing electrode comprising a first sharing electrode and a second sharing electrode electrically connected to the first sharing electrode;

the array substrate further comprising a base substrate, a first metal layer disposed on one side of the base substrate, and a second metal layer disposed on one side of the first metal layer away from the base substrate; the gate lines and the first sharing electrode being formed in the first metal layer, and the data lines and the second sharing electrode being formed in the second metal layer; the projection of the first sharing electrode on the base substrate at least partially overlapping the projection of the pixel electrode on the base substrate.

2. The array substrate of claim 1, further comprising a first insulating layer, wherein the first insulating layer at least partially covers the first sharing electrode and defines an adapter hole; the second sharing electrode is electrically connected to the first sharing electrode through the adapter hole.

3. The array substrate of claim 2, wherein the first pixel electrode is located on one side of the gate line, and the second pixel electrode is located on the other side of the same gate line.

4. The array substrate of claim 3, further comprising a common electrode encircling the pixel electrode and a second insulating layer covering the second sharing electrode, wherein the second insulating layer defines a via hole, and the pixel electrode is electrically connected to the drive circuit through the via hole.

5. The array substrate of claim 4, wherein the via hole comprises a first via-hole and a second via-hole; the first pixel electrode is electrically connected to the first thin-film transistor through the first via-hole, and the second pixel electrode is electrically connected to the second thin-film transistor through the second via-hole; the first via-hole is close to the data line, the second via-hole is away from the same data line, and the adapter hole is away from the via hole relative to the same data line.

6. The array substrate of claim 5, wherein the first sharing electrode comprises a first segment of the first sharing electrode disposed between the base substrate and the pixel electrode and a second segment of the first sharing electrode disposed between the pixel electrode and the gate line; the second segment of the first sharing electrode disposed on one side of the first pixel electrode is electrically connected to one end of the second sharing electrode; the second segment of the first sharing electrode disposed on one side of the second pixel electrode is electrically connected to the other end of the second sharing electrode.

7. The array substrate of claim 6, wherein the first thin-film transistor, the second thin-film transistor, and the third thin-film transistor are disposed along the first direction.

8. The array substrate of claim 7, wherein the second segment of the first sharing electrode is wider than the first segment of the first sharing electrode.

9. The array substrate of claim 1, wherein the first sharing electrode comprises a first segment of the first sharing electrode disposed between the base substrate and the pixel electrode and a second segment of the first sharing electrode disposed between the pixel electrode and the gate line; the first segment of the first sharing electrode passes through the pixel electrode along the second direction.

10. The array substrate of claim 1, wherein the first thin-film transistor and the second thin-film transistor form a common-gate and common-source structure.

11. A display panel, comprising:
a color-film substrate;
an array substrate, disposed opposite to and spaced apart from the color-film substrate to define a receiving space, and comprising a plurality of gate lines extending along a first direction, a plurality of data lines extending along a second direction, a plurality of pixel units defined by intersections of the gate lines and the data lines, a base substrate, a first metal layer disposed on one side of the base substrate, and a second metal layer disposed on one side of the first metal layer away from the base substrate, wherein
the plurality of pixel units each comprise a pixel electrode, a drive circuit, and a sharing electrode; the pixel electrode comprises a first pixel electrode and a second pixel electrode; the drive circuit is electrically connected to the pixel electrode; the drive circuit comprises a first thin-film transistor, a second thin-film transistor, and a third thin-film transistor, the first thin-film transistor has a drain electrically connected to the first pixel electrode, the second thin-film transistor has a drain electrically connected to the second pixel electrode, and the third thin-film transistor has a source connected to the drain of the second thin-film transistor and has a drain connected to the sharing electrode; the sharing electrode comprises a first sharing electrode and a second sharing electrode electrically connected to the first sharing electrode; and
the gate lines and the first sharing electrode are formed in the first metal layer, and the data lines and the second sharing electrode are formed in the second metal layer; the projection of the first sharing electrode on the base substrate at least partially overlaps the projection of the pixel electrode on the base substrate; and
a liquid-crystal layer, disposed in the receiving space.

12. The display panel of claim 11, wherein the array substrate further comprises a first insulating layer, wherein the first insulating layer at least partially covers the first sharing electrode and defines an adapter hole; the second sharing electrode is electrically connected to the first sharing electrode through the adapter hole.

13. The display panel of claim 12, wherein the first pixel electrode is located on one side of the gate line, and the second pixel electrode is located on the other side of the same gate line.

14. The display panel of claim 13, wherein the array substrate further comprises a common electrode encircling the pixel electrode and a second insulating layer covering the second sharing electrode, wherein the second insulating layer defines a via hole, and the pixel electrode is electrically connected to the drive circuit through the via hole.

15. The display panel of claim 14, wherein the via hole comprises a first via-hole and a second via-hole; the first pixel electrode is electrically connected to the first thin-film transistor through the first via-hole, and the second pixel electrode is electrically connected to the second thin-film transistor through the second via-hole; the first via-hole is close to the data line, the second via-hole is away from the same data line, and the adapter hole is away from the via hole relative to the same data line.

16. The display panel of claim 15, wherein the first sharing electrode comprises a first segment of the first sharing electrode disposed between the base substrate and the pixel electrode and a second segment of the first sharing electrode disposed between the pixel electrode and the gate line; the second segment of the first sharing electrode disposed on one side of the first pixel electrode is electrically connected to one end of the second sharing electrode; the second segment of the first sharing electrode disposed on one side of the second pixel electrode is electrically connected to the other end of the second sharing electrode.

17. The display panel of claim 16, wherein the first thin-film transistor, the second thin-film transistor, and the third thin-film transistor are disposed along the first direction.

18. The display panel of claim 17, wherein the second segment of the first sharing electrode is wider than the first segment of the first sharing electrode.

19. The display panel of claim 11, wherein the first sharing electrode comprises a first segment of the first sharing electrode disposed between the base substrate and the pixel electrode and a second segment of the first sharing electrode disposed between the pixel electrode and the gate line; the first segment of the first sharing electrode passes through the pixel electrode along the second direction.

* * * * *